(12) United States Patent
Mollat et al.

(10) Patent No.: US 7,986,010 B2
(45) Date of Patent: Jul. 26, 2011

(54) HIGH-VOLTAGE VARIABLE BREAKDOWN VOLTAGE (BV) DIODE FOR ELECTROSTATIC DISCHARGE (ESD) APPLICATIONS

(75) Inventors: Martin B. Mollat, McKinney, TX (US); Tony Thanh Phan, Flower Mound, TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 12/759,391

(22) Filed: Apr. 13, 2010

(65) Prior Publication Data
US 2010/0193868 A1    Aug. 5, 2010

Related U.S. Application Data

(62) Division of application No. 11/708,190, filed on Feb. 20, 2007, now Pat. No. 7,709,329.

(51) Int. Cl.
*H01L 23/62* (2006.01)
(52) U.S. Cl. ......... 257/355; 257/173; 257/360; 257/343
(58) Field of Classification Search .................. 257/176, 257/360–362, 343–355; 438/140, 174, 194, 438/275, 281
See application file for complete search history.

(56) References Cited

U.S. PATENT DOCUMENTS

| | | |
|---|---|---|
| 5,436,578 A | 7/1995 | Brown et al. |
| 5,547,887 A | 8/1996 | Brown et al. |
| 5,591,661 A | 1/1997 | Shiota |
| 6,518,604 B1 | 2/2003 | Worley et al. |
| 6,552,879 B2 | 4/2003 | Voldman |
| 6,624,481 B1 | 9/2003 | Pendharkar et al. |
| 6,909,149 B2 | 6/2005 | Russ et al. |
| 7,164,566 B2 | 1/2007 | Xu et al. |
| 2002/0097532 A1 | 7/2002 | Voldman |
| 2007/0278568 A1 | 12/2007 | Williams et al. |

*Primary Examiner* — Dung A. Le
(74) *Attorney, Agent, or Firm* — Warren L. Franz; Wade J. Brady, III; Frederick J. Telecky, Jr (57) ABSTRACT

Formation of an electrostatic discharge (ESD) protection device having a desired breakdown voltage (BV) is disclosed. The breakdown voltage (BV) of the device can be set, at least in part, by varying the degree to which a surface junction between two doped areas is covered. This junction can be covered in one embodiment by a dielectric material and/or a semiconductor material. Moreover, a variable breakdown voltage can be established by concurrently forming, in a single process flow, multiple diodes that have different breakdown voltages, where the diodes are also formed concurrently with circuitry that is to be protected. To generate the variable or different breakdown voltages, respective edges of isolation regions can be extended to cover more of the surface junctions of different diodes. In this manner, a first diode can have a first breakdown voltage (BV1), a second diode can have a second breakdown voltage (BV2), a third diode can have a third breakdown voltage (BV3), etc. This can provide substantial efficiency and cost savings where there may be varying ESD requirements.

16 Claims, 5 Drawing Sheets

HIGH-VOLTAGE VARIABLE BREAKDOWN VOLTAGE (BV) DIODE FOR ELECTROSTATIC DISCHARGE (ESD) APPLICATIONS

This is a division of U.S. application Ser. No. 11/708,190, filed Feb. 20, 2007, the entirety of which is incorporated herein by reference.

BACKGROUND

The disclosure herein relates generally to the art of semiconductor processing, and more particularly to forming a high voltage variable breakdown voltage (BV) diode for electrostatic discharge (ESD) applications.

Electrostatic discharge (ESD) is a continuing problem in the design, manufacture and utilization of semiconductor devices. A major source of ESD exposure to ICs is from the human body (described by the "Human Body Model", HBM). In this situation, a packaged IC acquires a charge when it is held by a human who is electrostatically charged (e.g., from walking across carpeting). A charge of about 0.6 μC can be induced on a body capacitance of 150 pF, for example, leading to electrostatic potentials of 4 kV or greater and discharging peak currents of several amperes to the IC for about 100 ns, for example. A second source of ESD is from metallic objects (described by the "Machine model", MM), which is characterized by a greater capacitance, lower internal resistance and transients that have significantly higher rise times and current levels than the HBM ESD source. A third source is described by the "charged device model" (CMD), in which the IC itself becomes charged and discharges to ground in rise times less than 500 ps in the opposite direction than the HBM and MM ESD sources.

During ESD events, current is typically discharged between one or more pins or pads exposed to the outside of an IC chip. Such ESD current flows from the pad to ground through vulnerable circuitry in the IC, which may not be designed to carry such currents. Many ESD protection techniques have been employed to reduce or mitigate the adverse effects of ESD events in integrated circuit devices. Many conventional ESD protection schemes for ICs employ peripheral circuits to carry the ESD currents from the pin or pad of the device to ground by providing a low impedance path thereto. In this way, the ESD currents flow through the protection circuitry, rather than through the more susceptible circuits in the chip.

Such protection circuitry is typically connected to I/O and other pins or pads on the IC, wherein the pads further provide the normal circuit connections for which the IC was designed. Some ESD protection circuits carry ESD currents directly to ground, and others provide the ESD current to the supply rail of the IC for subsequent routing to ground. Rail-based clamping devices can be employed to provide a bypass path from the IC pad to the supply rail (e.g., VDD) of the device. Thereafter, circuitry associated with powering the chip is used to provide such ESD currents to the ground. Local clamps are more common, wherein the ESD currents are provided directly to ground from the pad or pin associated with the ESD event. Individual local clamps are typically provided at each pin on an IC, with the exception of the ground pin or pins.

Recently, the need for higher voltage analog components has made high voltage ESD protection devices desirable.

SUMMARY

The following presents a summary to provide a basic understanding of one or more aspects of the disclosure herein. This summary is not an extensive overview. It is intended neither to identify key or critical elements nor to delineate scope of the disclosure herein. Rather, its primary purpose is merely to present one or more aspects in a simplified form as a prelude to a more detailed description that is presented later.

Formation of an electrostatic discharge (ESD) protection device having a desired breakdown voltage (BV) is disclosed. The breakdown voltage (BV) of the device can be set, at least in part, by varying the degree to which a surface junction between two doped areas is covered. This junction can be covered in one embodiment by a dielectric material and/or a semiconductor material. Moreover, a variable breakdown voltage can be established by concurrently forming, in a single process flow, multiple diodes that have different breakdown voltages, where the diodes are also formed concurrently with circuitry that is to be protected. To generate the variable or different breakdown voltages, respective edges of isolation regions can be extended to cover more of the surface junctions of different diodes. In this manner, a first diode can have a first breakdown voltage (BV1), a second diode can have a second breakdown voltage (BV2), a third diode can have a third breakdown voltage (BV3), etc. This can provide substantial efficiency and cost savings where there may be varying ESD requirements.

To the accomplishment of the foregoing and related ends, the following description and annexed drawings set forth certain illustrative aspects. Other aspects, advantages and/or features may, however, become apparent from the following detailed description when considered in conjunction with the annexed drawings.

DETAILED DESCRIPTION OF EXAMPLE EMBODIMENTS OF THE INVENTION

The description herein is made with reference to the drawings, wherein like reference numerals are generally utilized to refer to like elements throughout, and wherein the various structures are not necessarily drawn to scale. In the following description, for purposes of explanation, numerous specific details are set forth in order to facilitate understanding. It may be evident, however, to one skilled in the art, that one or more aspects described herein may be practiced with a lesser degree of these specific details. In other instances, known structures and devices are shown in block diagram form to facilitate understanding.

Figure 1:
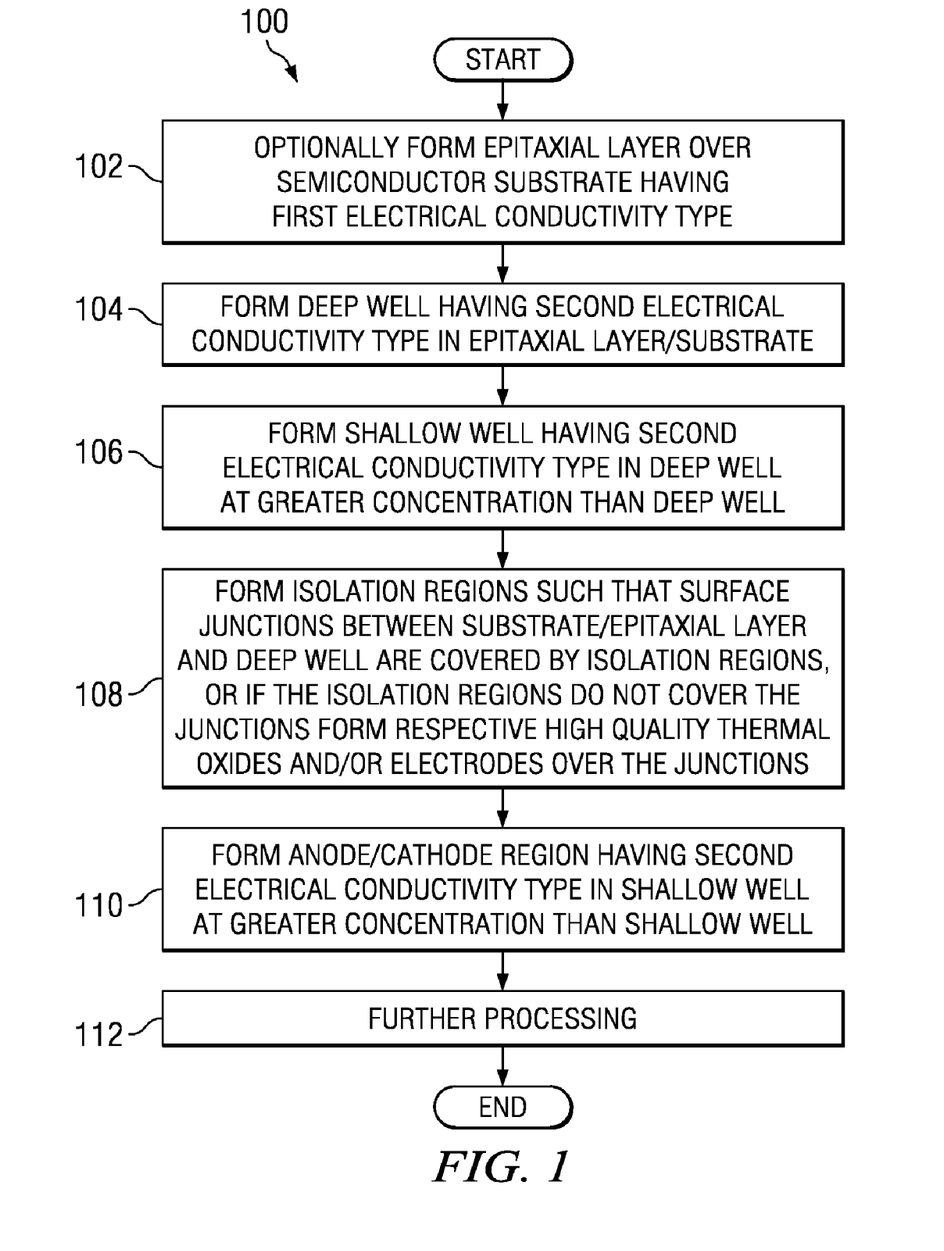
FIG. 1 is a flow diagram illustrating an example methodology for forming an electrostatic discharge (ESD) protection device having a desired breakdown voltage (BV).

An example methodology 100 for forming an electrostatic discharge (ESD) protection device having a desired breakdown voltage is illustrated in FIG. 1, and an example semiconductor substrate or workpiece 200 whereon such a device is formed according to the methodology 100 is illustrated in cross-sectional view in FIGS. 2-8. Additionally, while a single ESD protection device is initially described, it will be appreciated that a variable breakdown voltage can be established in a single process flow in accordance with the disclosure herein by concurrently forming multiple ESD devices having different breakdown voltages. Further, it will be appreciated that the breakdown voltage can be varied over a range of breakdown voltages based upon a relative positioning of an overlying isolation region and an underlying diode junction region.

While the method 100 is illustrated and described below as a series of acts or events, it will be appreciated that the illustrated ordering of such acts or events are not to be interpreted in a limiting sense. For example, some acts may occur in different orders and/or concurrently with other acts or events apart from those illustrated and/or described herein. In addition, not all illustrated acts may be required to implement one or more aspects or embodiments of the description herein. Further, one or more of the acts depicted herein may be carried out in one or more separate acts and/or phases.

Figure 2:
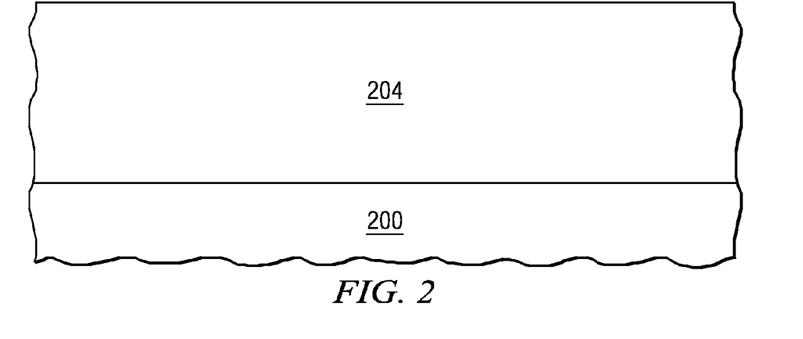
FIGS. 2-8 are cross-sectional views of an example semiconductor substrate having an electrostatic discharge (ESD) protection device with a desired breakdown voltage (BV) associated therewith.

At 102, an optional epitaxial (EPI) layer 204 is formed over the surface of the substrate 200 (FIG. 2). The EPI layer 204 (or the substrate 200 if the optional EPI layer 204 is not formed) has a first electrical conductivity type (e.g., P-type). In one example, to promote the first electrical conductivity type, the EPI layer 204 has a dopant concentration of Boron of between about $1.0e15/cm^3$ and about $3.0e15/cm^3$, for example, and may be formed to a thickness of between about 8.5 microns and about 9.5 microns, for example. It will be appreciated that a substrate as referred to herein may comprise any type of semiconductor body (e.g., silicon, SiGe, SOI) such as a semiconductor wafer, as well as any other type of semiconductor and/or epitaxial layers formed thereon and/or otherwise associated therewith.

Figure 3:
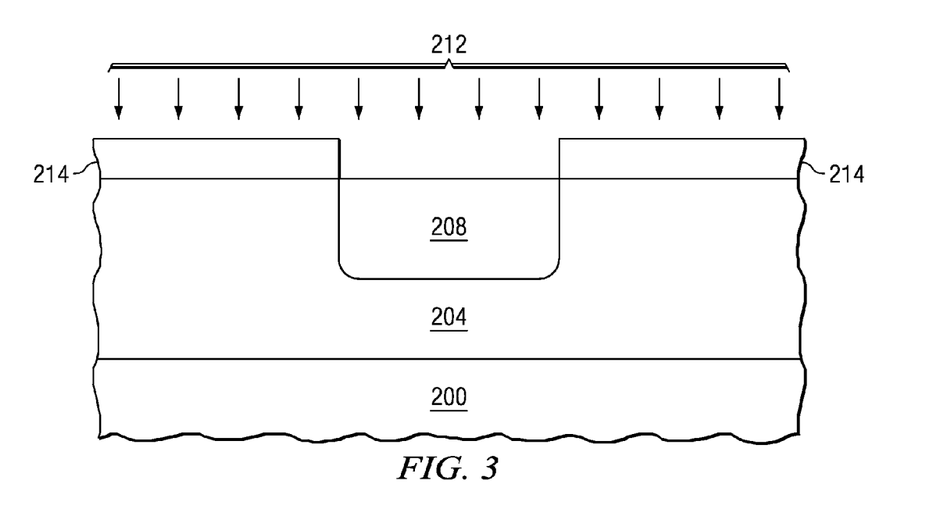

At 104, a deep well 208 is formed in the EPI layer 204 (or in the substrate 200 if the optional EPI layer 204 is not formed) (FIG. 3). The deep well 208 has a second electrical conductivity type (e.g., N-type) and may be formed by a first implantation process 212, where portions of the EPI layer 204 (or substrate 200) where the deep well 208 is not to be formed are masked off by a patterned mask such as a first photoresist 214. In one example, the deep well 208 may have a dopant concentration of Phosphorus of between about $1.0e16/cm^3$ and about $5.0e16/cm^3$, for example. It will be appreciated that the patterning of the first resist 214 (as with all masking and/or patterning mentioned herein) can be performed in any suitable manner, such as with lithographic techniques, for example, where lithography broadly refers to processes for transferring one or more patterns between various media. In lithography, a light sensitive resist coating (e.g., 214) is formed over one or more layers which are to be treated. The resist coating is then patterned by exposing it to one or more types of radiation or light which (selectively) passes through an intervening lithography mask containing the pattern. The light causes exposed or unexposed portions of the resist coating to become more or less soluble, depending on the type of resist used. A developer is then used to remove the more soluble areas leaving the patterned resist. The patterned resist can then serve as a mask for the underlying layer or layers which can be selectively treated (e.g., doped).

Figure 4:
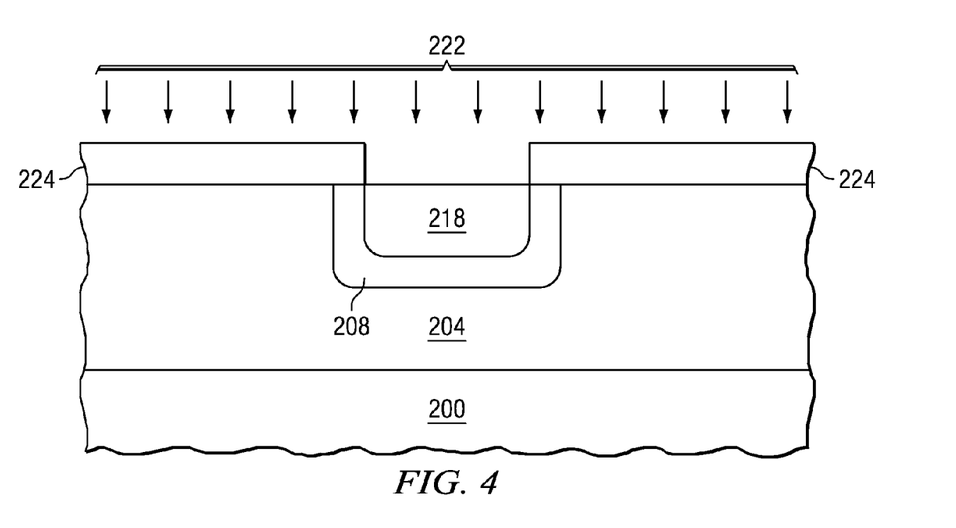

A shallow well 218 is then formed within the deep well 208 at 106 (after the first patterned resist 214 has been removed) (FIG. 4). As with the deep well 208, the shallow well 218 has the second electrical conductivity type. The shallow well 218 does, however, have a higher dopant concentration than the deep well 208. For example, the shallow well 218 may have a dopant concentration of Phosphorus between about $5.0e16/cm^3$ and about $3.0e17/cm^3$ (or, e.g., $2.0e17/cm^3$), for example. Additionally, the shallow well 218 may be formed by a second implantation process 222 where a mask such as a second patterned resist 224 masks off regions of the EPI layer 204 (or substrate 200) and portions of the deep well 208 where the shallow well 218 is not to be formed.

Figure 5:
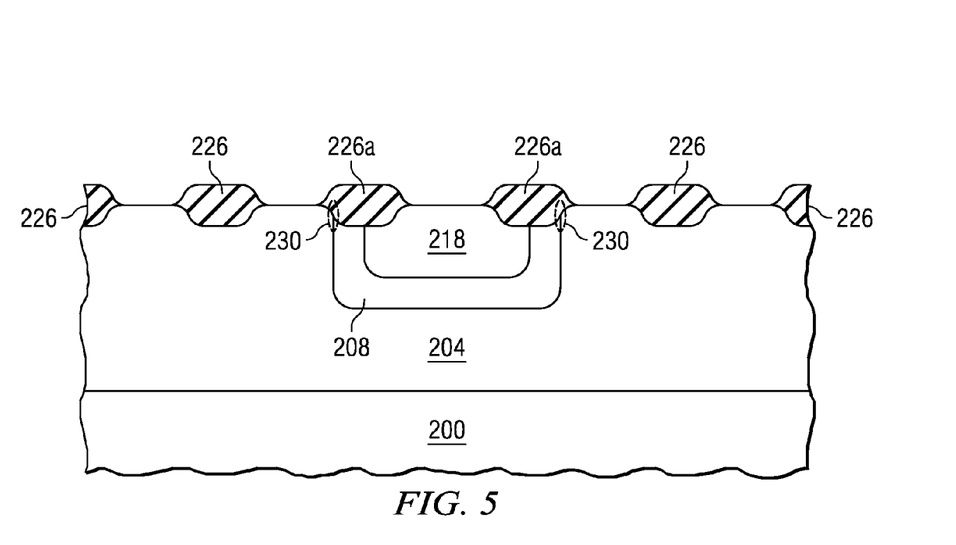

At 108, isolation regions 226 are formed in the surface of the EPI layer 204 (or substrate 200) (FIG. 5). The isolation regions 226 can comprise LOCOS (local oxidation of silicon) FOX (field oxide) regions and/or STI (shallow trench isolation) regions, for example. Although not illustrated, to implement LOCOS isolation regions, a hardmask (e.g., of $Si_3N_4$) may be formed over the EPI layer 204 (or substrate 200) and patterned so that underlying areas where the isolation regions are to be formed are exposed. Then, one or more dopants (e.g., Boron) can be implanted into these exposed areas to form channel stops that mitigate the formation of inversion layers which could create undesirable conductive channels between adjacent devices. A relatively thick (e.g., around 500 nm) oxide pad (e.g., $SiO_2$) is then grown in the exposed areas, where the hardmask inhibits such growth in locations other than these areas. The hardmask is then removed, leaving the LOCOS or FOX isolation regions.

Figure 6:
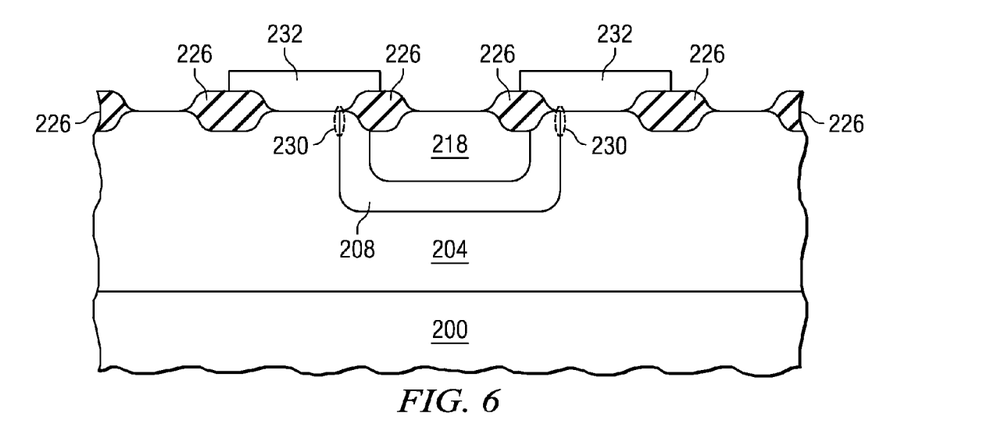

Notably, some of the isolation regions 226a extend over the junction 230 between layer 204 and deep well 208 at the surface of layer 204 (or substrate 200). As will be appreciated, this covering of the junction with regions 226a helps to establish a desired breakdown voltage (BV) of the device. FIG. 6 illustrates an alternative example where the isolation regions 226 do not cover the surface junction 230 between layer 204 and deep well 208. Instead, the surface of layer 204 (or substrate 200) is covered by a dielectric or semiconductor material 232 at this junction. For example, after the isolation regions 226 are formed, a layer of high quality thermally grown oxide and/or a layer of polysilicon material is formed (and patterned) over this surface junction 230. Forming polysilicon over the oxide (instead of directly over layer 204) may be desirable to mitigate leakage, for example. As will be appreciated, forming a layer of high quality thermally grown oxide and/or a layer of polysilicon material also helps to establish a desired breakdown voltage (BV).

Figure 7:
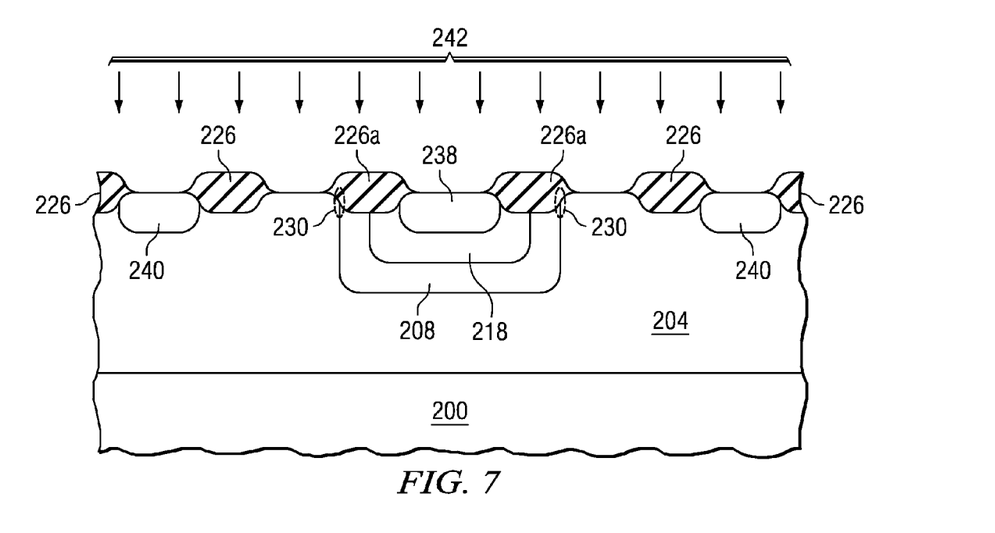

At 110, an anode or cathode region 238 is formed in the shallow well 218 (FIG. 7). Like the deep 208 and shallow 218 wells, the anode or cathode region 238 has the second electrical conductivity type. The anode or cathode region 238 has a higher dopant concentration than wells 208, 218. For example, the anode or cathode region 238 may have a dopant concentration of Phosphorus, Arsenic and/or Antimony of between about $1.0e19/cm^3$ and about $1.0e20/cm^3$, for example. The anode or cathode region 238 may be formed by a third implantation process 242 where a mask such as a third patterned resist (not shown) masks off regions of the EPI layer 204 (or substrate 200) where the anode or cathode region 238 is not to be formed. Similarly, cathode or anode regions 240 are also formed in the surface of layer 204 (or substrate 200) between adjacent isolation regions 226. The cathode or anode regions 240 have the first electrical conductivity type, and may be formed with a fourth implantation through a fourth patterned mask (not shown). The cathode or anode regions 240 have a higher dopant concentration than layer 204 (or substrate 200). For example, the cathode or anode regions 240 may have a dopant concentration of Boron of between about $1.0e18/cm^3$ and about $5e19/cm^3$.

Figure 8:
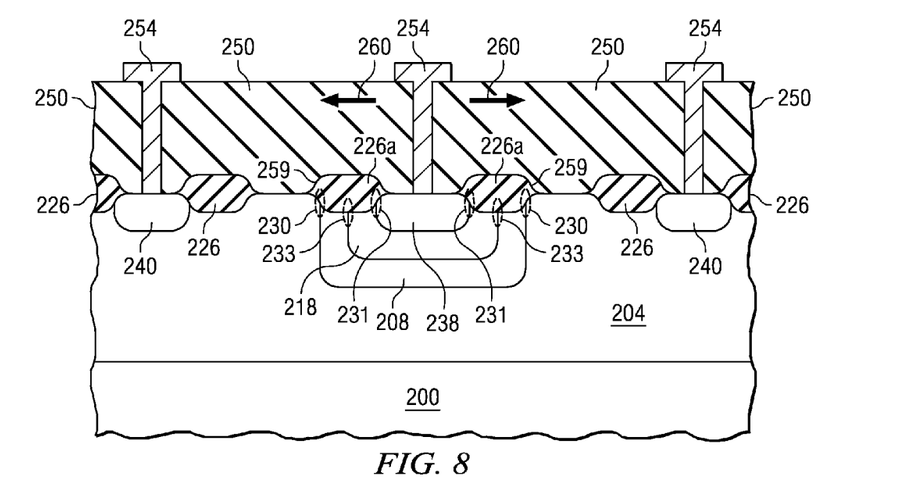

After regions 238 and 240 are formed, further (back-end) processing is performed at 112 (FIG. 8). For example, an insulating layer of dielectric material (e.g., metal layer oxidation (MLO)) 250 may be formed, followed by establishing electrical contacts 254 down through this layer to regions 238 and 240. One or more dielectric and/or conductive layers may thereafter be similarly formed and/or patterned.

Figure 9:
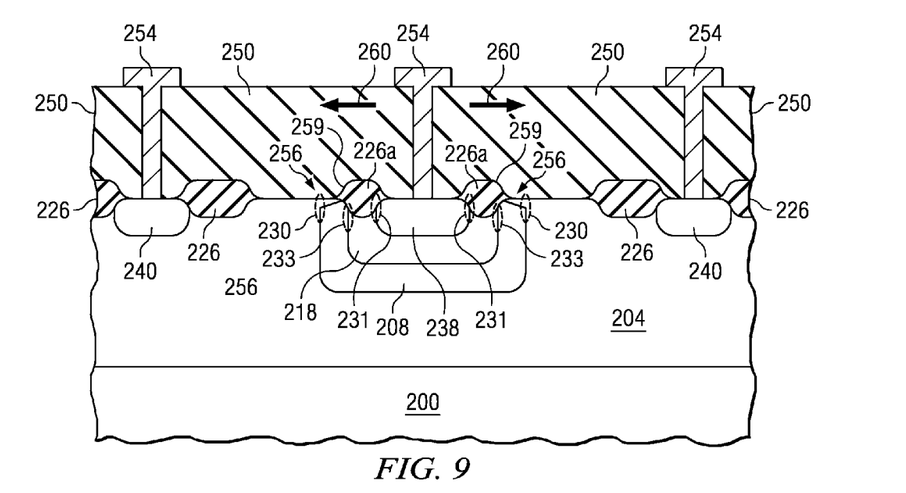
FIG. 9 is a cross-sectional view of an example semiconductor substrate where "hook back" in a diode is illustrated.

FIG. 9 illustrates a situation where the surface junction 230 between the deep well 208 and layer 204 is not covered by an isolation region 226a or a dielectric or semiconductor material 232 (FIG. 6). In this situation, a "hook back" 256 having the first electrical conductivity type forms over the junction 230. This "hook back" is attributable, at least in part, to dopants from layer 204, to dopants used to establish channel stops when forming the isolation regions 226 and/or to dopants implanted into the surface of layer 204 as part of a threshold voltage (Vt) adjustment implant (not shown) that may be performed after the isolation regions 226 are formed. In any event, this "hook back" 256 affects (e.g., reduces) the breakdown voltage (BV) of the device. More particularly, the hook back 256 allows an enhanced electric field to develop near the surface of layer 204 (where junction 230 would otherwise be), which results in an early breakdown of the diode.

Accordingly, forming the isolation regions 226a over the junction 230 (FIG. 8) mitigates this "hook back" 256 and thereby mitigates early breakdown of the diode. The breakdown voltage (BV) of the diode can thus be set or controlled by varying the degree to which the junction 230 is covered by isolation regions 226a. More particularly, respective edges 259 of the isolation regions 226a can be moved in directions indicated by arrows 260 (FIGS. 8, 9) to lengthen or extend the width of the isolation regions 226a and thereby mitigate more and more of the hook back 256. Extending the isolation regions 226a in this manner varies (e.g., increases) the BV of the device and can be effected, for example, by patterning a (hard) mask used to establish the isolation regions 226a (e.g., at 108) to have larger openings—the isolation regions 226a being self-aligned with the (hard) mask, or rather the openings therein. In one example, the BV of the device can be controlled to be between about 90V and about 180V, where this range allows the diode to effectively serve as an ESD protection device to "shunt" excess current away from vulnerable integrated circuitry.

In FIG. 8, the isolation region 226a extends from slightly over the anode or cathode region 238 to slightly over layer 204. In this manner, in addition to extending over the surface junction 230, the isolation region 226a also extends over a surface junction 231 between anode or cathode region 238 and shallow well 218, as well as over a surface junction 233 between shallow well 218 and deep well 208. By contrast, while the isolation region 226a in FIG. 9 does cover surface junctions 231 and 233, it fails to cover surface junction 230.

It can be appreciated that the bond quality at the surface junction 230 also affects the breakdown voltage of the device. As such, forming a high quality thermally grown oxide and/or a layer of polysilicon material over the surface junction 230 as discussed above with regard to FIG. 6 serves to stabilize the breakdown voltage (BV) of the device by establishing more uniformity or regularity at the surface. In the absence of such features, residues, by-products, contaminants and/or other irregularities (e.g., that may result from etching or other processing activities) may remain near the surface junction 230. These items can lead to undesirable surface effects whereby the breakdown voltage may fluctuate beyond acceptable tolerances, for example. Forming a high quality oxide and/or a layer of polysilicon material over the surface junction 230 thus tightens the distribution of the BV of the device. Additionally, forming polysilicon over the surface junction 230 adds another degree of control over the breakdown voltage of the diode. For example, the polysilicon can serve as an electrode and can thus be biased to push the breakdown further down into layer 204 (or substrate 200), and thus away from any surface effects that may undesirably alter the breakdown voltage. Moreover, the polysilicon can be used in this capacity regardless of whether it also resides over the high quality oxide—due in large part to the thinness of such an oxide.

It will be appreciated that forming an ESD protection device as described herein can be readily implemented in a CMOS fabrication process. Accordingly, the ESD protection device can be fabricated concurrently (and thus efficiently) with the circuit components that it is to protect. By way of example, the layer of high quality oxide and the layer of polysilicon described above with regard to FIG. 6 may be formed as part of a MOS transistor gate formation process. A high quality oxide can be grown on selectively exposed (e.g., through a patterned mask) areas of the substrate, followed by a blanket deposition of polysilicon, for example. These layers can then be patterned to establish the MOS transistor gate as well as layer(s) 232 over the surface junction 230, where such patterning occurs in a single act. Similarly, the third and fourth implantation processes used to form the anode or cathode 238 and cathode or anode 240 regions, respectively, may correspond to source/drain and drain/source implantations. In this manner, regions 238 and 240 may be formed concurrently with source and drain regions, thus conserving resources.

Moreover, a variable breakdown voltage can be established in a single (CMOS) process flow by concurrently forming multiple diodes having different breakdown voltages. The diodes can then be used to satisfy different ESD application requirements. Concurrently forming multiple diodes that have different breakdown voltages can be accomplished, for example, by patterning a hardmask to have different size openings therein so that resulting isolation regions 226a (that are self-aligned with the (openings in) the hardmask) have different widths and thus cover respective surface junctions 230 of different diodes by varying amounts (e.g., as illustrated with arrows 260 in FIGS. 8 and 9).

By way of example, in a single process flow, a hardmask can be patterned so that a first isolation region is extended a first amount to cover a surface junction of a first diode so that the first diode has a first breakdown voltage (BV1), a second isolation region is extended a second amount to cover a surface junction of a second diode so that the second diode has a second breakdown voltage (BV2), a third isolation region is extended a third amount to cover a surface junction of a third diode so that the third diode has a third breakdown voltage (BV3), etc., where BV1, BV2 and BV2 are all different and where the diodes are also formed concurrently with circuitry to be protected. As such, where a variable BV is desired (e.g., by a designer), these requirements can be satisfied by determining the degree to which different isolation regions need to be extended/formed to establish different breakdown voltages for different diodes, and then patterning a hardmask to form such isolation regions.

Additionally, while reference is made throughout this document to exemplary structures in discussing aspects of methodologies described herein (e.g., those structures presented in FIGS. 2-8 while discussing the methodology set forth in FIG. 1), those methodologies are not to be limited by the corresponding structures presented. Rather, the methodologies (and structures) are to be considered independent of one another and able to stand alone and be practiced without regard to any of the particular aspects depicted in the Figs. Additionally, layers described herein, can be formed in any suitable manner, such as with spin on, sputtering, growth and/or deposition techniques, etc.

Also, equivalent alterations and/or modifications may occur to those skilled in the art based upon a reading and/or understanding of the specification and annexed drawings. The disclosure herein includes all such modifications and alterations and is generally not intended to be limited thereby. In addition, while a particular feature or aspect may have been disclosed with respect to only one of several implementations, such feature or aspect may be combined with one or more other features and/or aspects of other implementations as may be desired. Furthermore, to the extent that the terms "includes", "having", "has", "with", and/or variants thereof are used herein, such terms are intended to be inclusive in meaning—like "comprising." Also, "exemplary" is merely meant to mean an example, rather than the best. It is also to be appreciated that features, layers and/or elements depicted herein are illustrated with particular dimensions and/or orientations relative to one another for purposes of simplicity and ease of understanding, and that the actual dimensions and/or orientations may differ substantially from that illustrated herein.

What is claimed is:

1. An electrostatic discharge (ESD) protection device having a desired breakdown voltage (BV), comprising:
    a semiconductor substrate having a first electrical conductivity type and a top surface;
    a deep well having a second electrical conductivity type formed in the substrate;
    a shallow well having the second electrical conductivity type formed in the deep well; the shallow well having a higher dopant concentration than the deep well; a junction of the deep well with the shallow well at the top surface defining a first surface junction; and a junction of the deep well with the substrate at the surface defining a second surface junction;
    an isolation region in the surface formed following formation of the deep well and the shallow well; the isolation region covering the first surface junction and a partial portion of the surface extending from the first surface junction to the second surface junction; and
    one of an anode or cathode region formed in the shallow well; the one of the anode or cathode region being of the second electrical conductivity type and having a higher dopant concentration than the shallow well;
    wherein the breakdown voltage is established by the amount of the partial portion covered by the isolation region.

2. The device of claim 1, wherein the isolation region is formed to also cover a surface junction between the one of the anode or cathode region and the shallow well.

3. The device of claim 2, wherein the isolation region extends from slightly over the one of the anode or cathode region to slightly over the portion of the surface extending from the first surface junction to the second surface junction.

4. The device of claim 3, where the isolation region extends from slightly over the one of the anode or cathode region to slightly over the surface of the substrate.

5. The device of claim 2, further comprising a layer of dielectric material formed over the isolation region, the substrate and the one of the anode or cathode region.

6. The device of claim 5, comprising a conductive contact formed through the layer of dielectric material down to the one of the anode or cathode region.

7. The device of claim 6, further comprising a second isolation region formed in the surface of the substrate; and a different one of an anode or cathode region formed in the surface of the substrate; the different one of the anode or cathode region having the first electrical conductivity type, having a higher dopant concentration than the substrate, and being separated from the one of the anode or cathode region by the first and second isolation regions.

8. The device of claim 1, further comprising a second isolation region formed in the surface of the substrate; and a different one of an anode or cathode region formed in the surface of the substrate; the different one of the anode or cathode region having the first electrical conductivity type, having a higher dopant concentration than the substrate, and being separated from the one of the anode or cathode region by the first and second isolation regions.

9. The device of claim 8, wherein the substrate has a dopant concentration of Boron of between about $1.0e15/cm^3$ and about $3.0e15/cm^3$.

10. The device of claim 9, wherein the deep well has a dopant concentration of Phosphorus, Arsenic and/or Antimony of between about $1.0e16/cm^3$ and about $5.0e17/cm^3$.

11. The device of claim 10, wherein the shallow well has a dopant concentration of Phosphorus, Arsenic and/or Antimony of between about $5.0e16/cm^3$ and about $2.0e17/cm^3$.

12. The device of claim 11, wherein the one of the anode or cathode region has a dopant concentration of Phosphorus, Arsenic and/or Antimony of between about $1.0e19\ cm^3$ and about $1.0e20/cm^3$.

13. The device of claim 12, wherein the different one of the anode or cathode region has a dopant concentration of Boron of between about $1.0e18/cm^3$ and about $5e19/cm^3$.

14. An electrostatic discharge (ESD) protection device with different established breakdown voltages (BVs), comprising:
    a semiconductor substrate having a first electrical conductivity type and a surface;
    a first diode comprising:
        a first deep well formed in the substrate, the first deep well having a second electrical conductivity type;
        a first shallow well formed in the first deep well, the first shallow well having the second electrical conductivity type and having a higher dopant concentration than the first deep well; a junction of the first deep well with the first shallow well at the surface defining a first surface junction; and a junction of the first deep well with the substrate at the surface defining a second surface junction; and
        a first one of an anode or cathode region formed in the first shallow well, the first one of the anode or cathode region having the second electrical conductivity type and having a higher dopant concentration than the first shallow well;
    a second diode comprising:
        a second deep well formed in the substrate, the second deep well having the second electrical conductivity type;
        a second shallow well formed in the second deep well, the second shallow well having the second electrical conductivity type and having a higher dopant concentration than the second deep well; a junction of the second deep well with the second shallow well at the surface defining a third surface junction; and a junction of the second deep well with the substrate at the surface defining a fourth surface junction; and
        a second same one of the anode or cathode region formed in the second shallow well, the second same one of the anode or cathode region having the second electrical conductivity type and having a higher dopant concentration than the second shallow well;
    a first isolation region formed in the surface following formation of the first deep well and the first shallow well; the first isolation region covering the first surface junction and a first partial portion of the surface extending from the first surface junction to the second surface junction; and a second isolation region formed in the surface following formation of the second deep well and the second shallow well; the second isolation region covering the third surface junction and a second partial portion of the surface extending from the third surface junction to the fourth surface junction; the amount of the second partial portion covered being different than the amount of the first partial portion covered;

wherein the different breakdown voltages are established by the different first and second partial portion amounts covered.

15. The device of claim 14, further comprising:
a second diode formed on the semiconductor substrate, the second diode comprising:
 a second deep well in the substrate, the second deep well having the second electrical conductivity type;
 a second shallow well in the second deep well, the second shallow well having the second electrical conductivity type and having a higher dopant concentration than the second deep well; and
 a second anode or cathode region in the second shallow well, the second anode or cathode region having the second electrical conductivity type and having a higher dopant concentration than the second shallow well; and
 an edge of a second isolation region that covers a second surface junction between the substrate and the second deep well being extended so that an amount of the second surface junction that is covered by the second isolation region is different than the amount of the first surface junction that is covered by the first isolation region.

16. An electrostatic discharge (ESD) protection device with different established breakdown voltages (BVs), comprising:

a semiconductor substrate having a first electrical conductivity type and a surface;

first and second deep wells having a second electrical conductivity type concurrently formed in the substrate;

first and second shallow wells having the second electrical conductivity type concurrently formed in the first and second deep wells, respectively, the first and second shallow wells having higher dopant concentrations than the first and second deep wells; junctions of the first and second deep wells with the respective first and second shallow wells at the surface defining respective first and second surface junctions; and junctions of the first and second deep wells with the substrate at the surface defining respective third and fourth surface junctions;

first and second isolation regions concurrently formed in the surface following formation of the first and second deep wells and the first and second shallow wells; the first isolation region covering the first surface junction and a first partial portion of the surface extending from the first surface junction to the third surface junction; and the second isolation region covering the second surface junction and a second partial portion of the surface extending from the second surface junction to the fourth surface junction; the amount of the second partial portion covered being different than the amount of the first partial portion covered; and first and second anode or cathode regions having the second electrical conductivity type formed in the first and second shallow wells, respectively, the first and second anode or cathode regions having higher dopant concentrations than the first and second shallow wells;

wherein the different breakdown voltages are established by the different first and second partial portion amounts covered.

* * * * *